(12) United States Patent
Leclair et al.

(10) Patent No.: US 8,232,615 B2
(45) Date of Patent: Jul. 31, 2012

(54) PACKAGED DEVICE WITH ACOUSTIC TRANSDUCER AND AMPLIFIER

(75) Inventors: Timothy Leclair, Longmont, CO (US); Steve Martin, Fort Collins, CO (US); Bruce Beaudry, Windsor, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 139 days.

(21) Appl. No.: 12/710,636

(22) Filed: Feb. 23, 2010

(65) Prior Publication Data

US 2011/0204456 A1  Aug. 25, 2011

(51) Int. Cl.
*H01L 29/84* (2006.01)

(52) U.S. Cl. ......... 257/416; 257/676; 257/704; 257/660

(58) Field of Classification Search .................. 257/666, 257/670, 672, 674, 675, 676, 678, 704, 685, 257/659, 660, 416

See application file for complete search history.

(56) References Cited

U.S. PATENT DOCUMENTS

| | | | |
|---|---|---|---|
| 3,790,866 A | 2/1974 | Meyer et al. | |
| 4,942,456 A | 7/1990 | Sako | |
| 5,928,598 A | 7/1999 | Anderson et al. | |
| 6,487,864 B1 | 12/2002 | Platt et al. | |
| 6,696,753 B2 * | 2/2004 | Tokuhara | 257/692 |
| 6,704,131 B2 | 3/2004 | Liu | |
| 6,953,985 B2 | 10/2005 | Lin et al. | |
| 7,183,622 B2 | 2/2007 | Heck et al. | |
| 2004/0016995 A1 | 1/2004 | Kuo et al. | |
| 2005/0251995 A1 | 11/2005 | Kawamura et al. | |
| 2006/0001123 A1 | 1/2006 | Heck | |
| 2006/0163708 A1 * | 7/2006 | Yoshida | 257/678 |
| 2007/0164378 A1 | 7/2007 | MacGugan | |
| 2007/0200215 A1 | 8/2007 | Janke | |
| 2008/0098621 A1 | 5/2008 | Tzeng et al. | |
| 2008/0129143 A1 | 6/2008 | Cook et al. | |
| 2008/0203560 A1 * | 8/2008 | Suzuki | 257/723 |
| 2008/0219482 A1 * | 9/2008 | Sato | 381/174 |
| 2009/0116669 A1 | 5/2009 | Song | |
| 2010/0090295 A1 | 4/2010 | Zhe et al. | |
| 2011/0103632 A1 * | 5/2011 | Leclair et al. | 381/340 |

* cited by examiner

*Primary Examiner* — Ha Tran T Nguyen
*Assistant Examiner* — Thanh Y Tran

(57) ABSTRACT

A device includes: a lead frame having an aperture in a central portion thereof; at least one acoustic transducer mounted on the lead frame above the aperture and configured to convert between acoustic energy and an electrical signal with low signal losses; a housing connected to the lead frame and including a base portion on a same side of the lead frame as the acoustic transducer; an amplifier is provided on a base portion of the housing in close proximity to the acoustic transducer; and a lid configured together with the base portion of the housing to define a cavity, wherein the acoustic transducer and the amplifier are closely positioned within the MEMS device cavity.

18 Claims, 10 Drawing Sheets

PACKAGED DEVICE WITH ACOUSTIC TRANSDUCER AND AMPLIFIER

BACKGROUND

Small acoustic devices, including acoustic transducers, are being employed in a number of applications, including gas flow detectors, and structural flaw detectors for buildings, bridges, pressure piping. In some applications, an acoustic transducer only transmits acoustic signals. In other applications, an acoustic transducer only receives acoustic signals. In still other applications, an acoustic transducer transmits acoustic signals and receives acoustic signals. Generally, acoustic transducers convert received electrical signals to acoustic signals when operating in a transmit mode, and/or convert received acoustic signals to electrical signals when operating in a receive mode. In particular, in many devices and applications, the acoustic signal that is transmitted and/or received is an ultrasonic signal.

Acoustic transducers are manufactured using a variety of different technologies, including piezoelectric ultrasonic transducers and microelectromechanical system (MEMS) transducers. In the past, acoustic transducers have been manufactured with processes where the acoustic transducer element is placed in a metal, ceramic, or plastic package and a lid is bonded to the package. In a typical configuration, an electrical signal produced by the acoustic transducer is provided through a lead or wire from the package to an external amplifier provided on an external circuit board to which the packaged acoustic transducer is attached or connected.

However, the electrical signal transmitted via the lead or wire from the packaged acoustic transducer device to the external amplifier is subject to loss, noise and/or interference due to the length of the interconnect lead length, all of which can reduce the receiving sensitivity of the acoustic device.

What is needed, therefore, is an arrangement which can more efficiently couple electrical signals between an acoustic transducer and an amplifier.

SUMMARY

In an example embodiment a device comprises: a lead frame having an aperture in a central portion thereof; a semiconductor die mounted on the lead frame, and including at least one acoustic transducer disposed above the aperture and configured to convert between acoustic energy and an electrical signal; an acoustic horn integrally connected to the lead frame, the horn extending from the lead frame and comprising a throat positioned adjacent to the acoustic transducer and a mouth opening at an opposite end of the acoustic horn from the throat; a substrate mounted on a base portion of the acoustic horn; an amplifier mounted on the substrate and being electrically connected to the acoustic transducer; and a lid configured together with the base portion of the housing to define a cavity, wherein the acoustic transducer and the amplifier are positioned within the cavity.

In another example embodiment a device includes: a lead frame having an aperture in a central portion thereof; at least one acoustic transducer mounted on the lead frame above the aperture and configured to convert between acoustic energy and an electrical signal; a housing connected to the lead frame and including a base portion on a same side of the lead frame as the acoustic transducer; an amplifier provided on a base portion of the housing; and a lid configured together with the base portion of the housing to define a cavity, wherein the acoustic transducer and the amplifier are positioned within the cavity.

In yet another example embodiment, a device comprises: a lead frame; an housing having a base portion integrated with the lead frame, and a protruding portion extending from the lead frame; a lid configured together with the base portion of the housing to define a cavity; and an acoustic transducer and an amplifier electrically connected together and both disposed within the cavity.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions shown in the drawings may be arbitrarily increased or decreased for clarity of discussion. Wherever applicable and practical, like reference numerals refer to like elements.

DETAILED DESCRIPTION

In the following, detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices. As used herein, "approximately" means within 10%, and "substantially" means at least 75%. As used herein, when a first structure, material, or layer is said to cover a second structure, material, or layer, this includes cases where the first structure, material, or layer substantially or completely encases or surrounds the second structure, material or layer.

Figure 1:
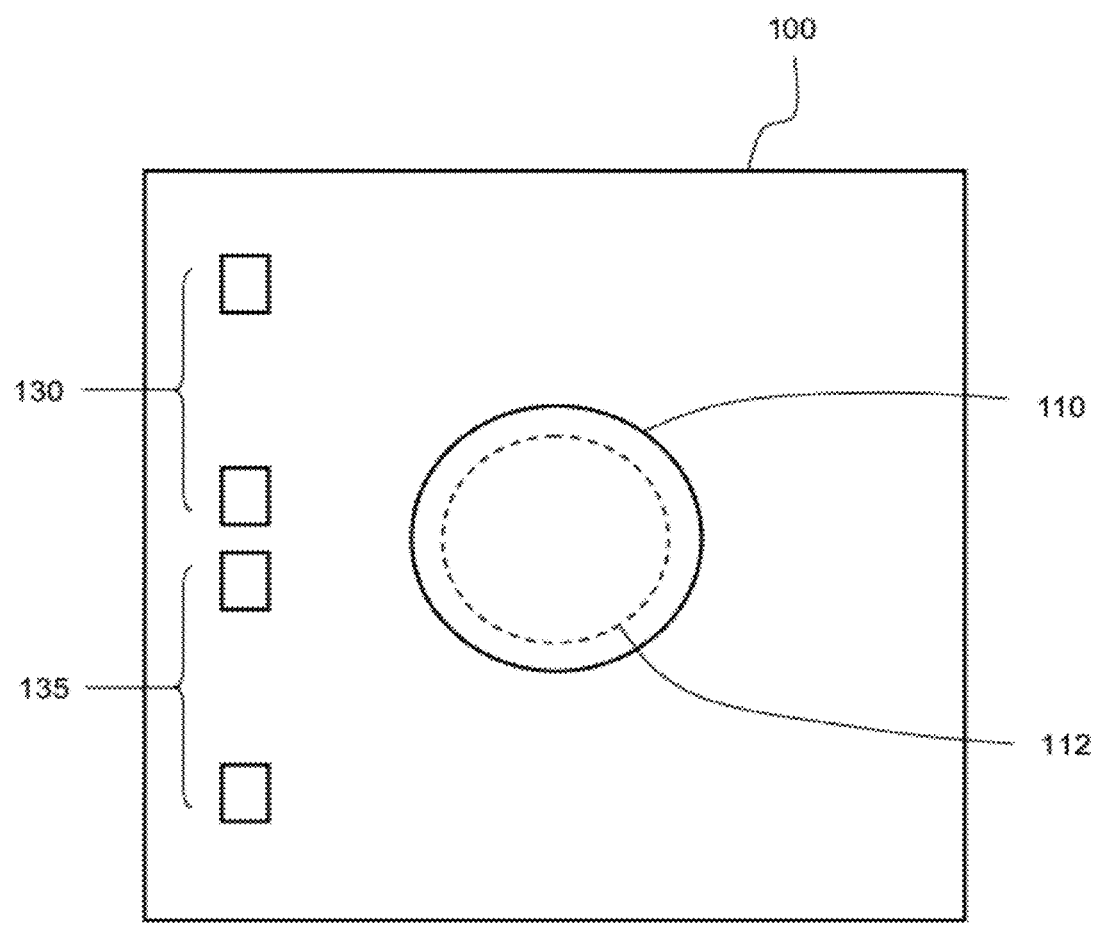
FIG. 1 shows one embodiment of a semiconductor die including an acoustic device.

FIG. 1 shows one embodiment of a semiconductor die 100 including an acoustic device 110. Semiconductor die also includes first electrode pads 130 connected to a first electrode of acoustic device 110, and second electrode pads 135 connected to a second electrode of acoustic device 110. In a beneficial embodiment, acoustic device 110 is a microelectromechanical system (MEMS) acoustic transducer having a diaphragm or membrane structure. A through hole 112 is provided beneath the diaphragm of acoustic device 110.

For illustration purposes only, in one embodiment semiconductor die 100 has dimensions of approximately 2 mm on each side, the diaphragm of acoustic device 110 has a diameter of 540-743 µm, and through hole 112 has a diameter of 410-613 µm.

Operationally, in some embodiments, acoustic device 110 may operate as a transmitting acoustic transducer to receive an electrical signal and to produce therefrom a corresponding acoustic signal or wave which is transmitted. In other embodiments, acoustic device 110 may operate as a receiving acoustic transducer to receive an acoustic signal or wave and to produce therefrom a corresponding electrical signal which is received. In still other embodiments, acoustic device may operate as both a transmitting acoustic transducer and a receiving acoustic transducer.

Figure 2:
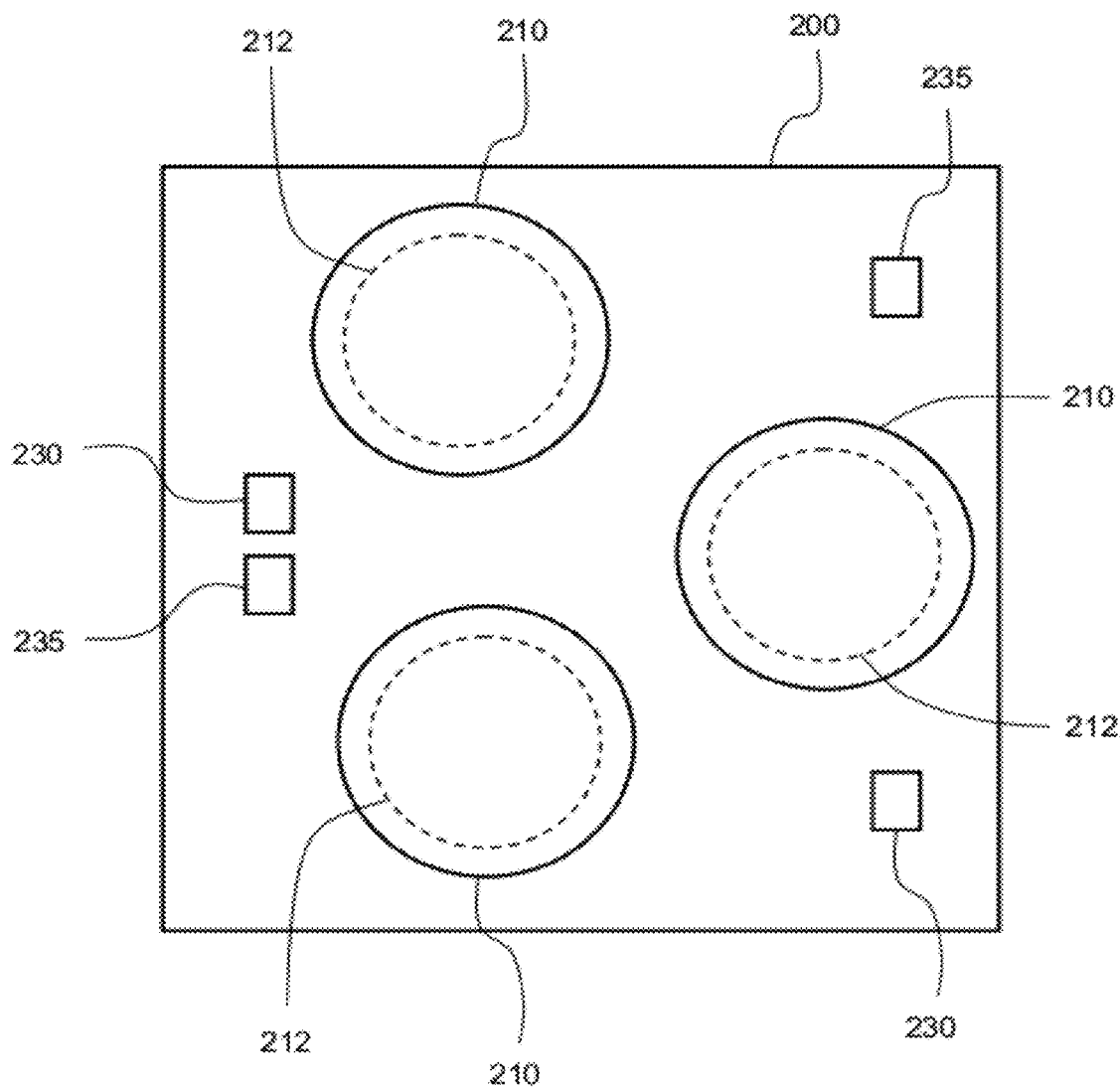
FIG. 2 shows one embodiment of a semiconductor die including a plurality of acoustic devices.

FIG. 2 shows one embodiment of a semiconductor die 200 including a plurality of acoustic devices 210. Semiconductor die also includes first electrode pads 230 connected to first electrodes of acoustic devices 210, and second electrode pads 235 connected to second electrodes of acoustic devices 210. In a beneficial embodiment, acoustic devices 210 are MEMS acoustic transducers each having a diaphragm or membrane structure. Through-holes 212 are provided beneath the diaphragms of acoustic devices 210.

For illustration purposes only, in one embodiment semiconductor die 200 has dimensions of approximately 2 mm on each side, the diaphragms of acoustic devices 210 each have a diameter of 525-779 µm, and through hole 112 has a diameter of 395-649 µm.

Figure 3:
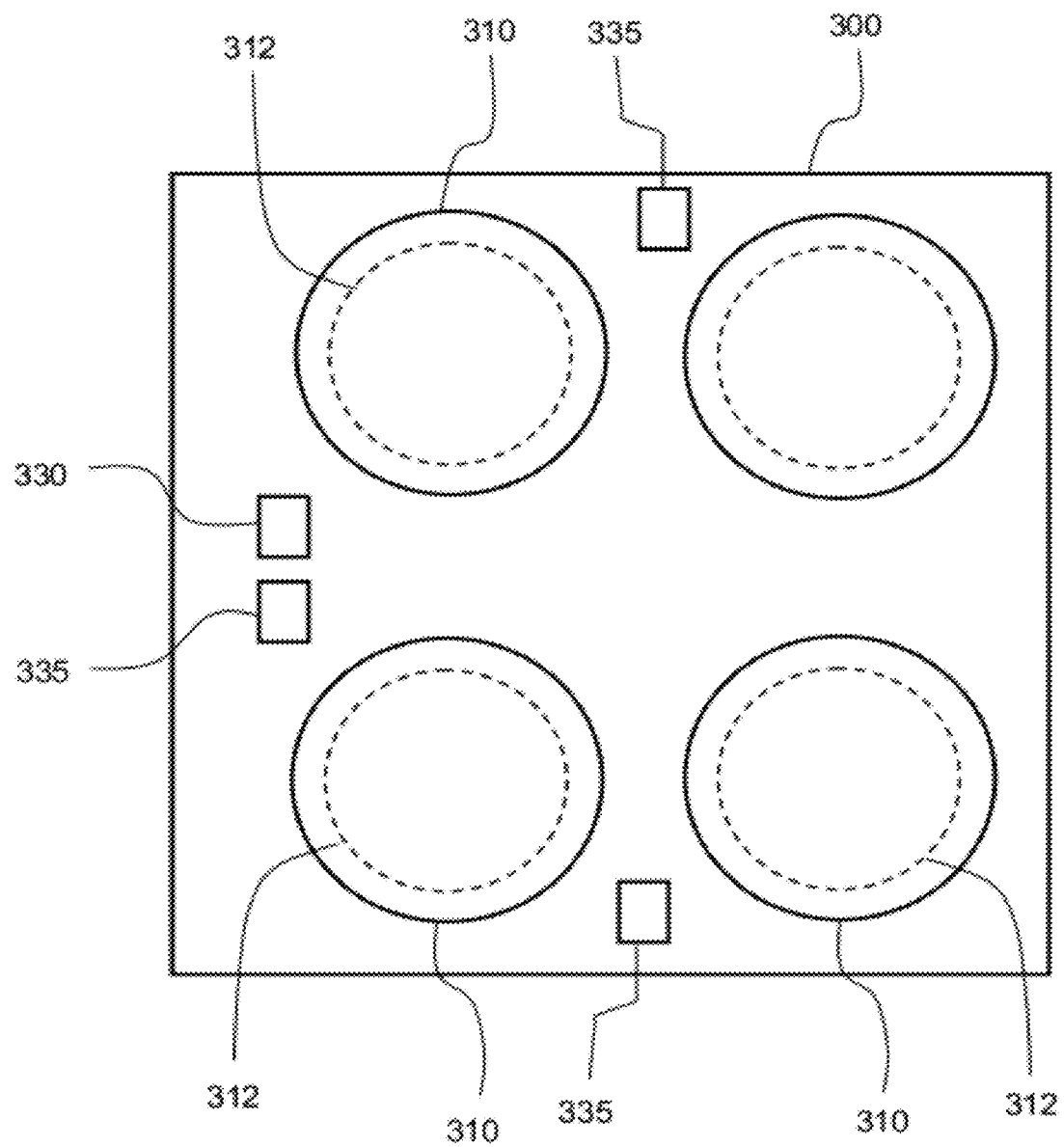
FIG. 3 shows another embodiment of a semiconductor die including a plurality of acoustic devices.

FIG. 3 shows another embodiment of a semiconductor die 300 including a plurality of acoustic devices 310. Semiconductor die also includes first electrode pads 330 connected to first electrodes of acoustic devices 310, and second electrode pads 335 connected to second electrodes of acoustic devices 310. In a beneficial embodiment, acoustic devices 310 are MEMS acoustic transducers each having a diaphragm or membrane structure. Through-holes 312 are provided beneath the diaphragms of acoustic devices 310.

For illustration purposes only, in one embodiment semiconductor die 300 has dimensions of approximately 2 mm on each side, the diaphragms of acoustic devices 310 each have a diameter of 525-779 µm, and through hole 112 has a diameter of 395-649 µm.

Figure 4:
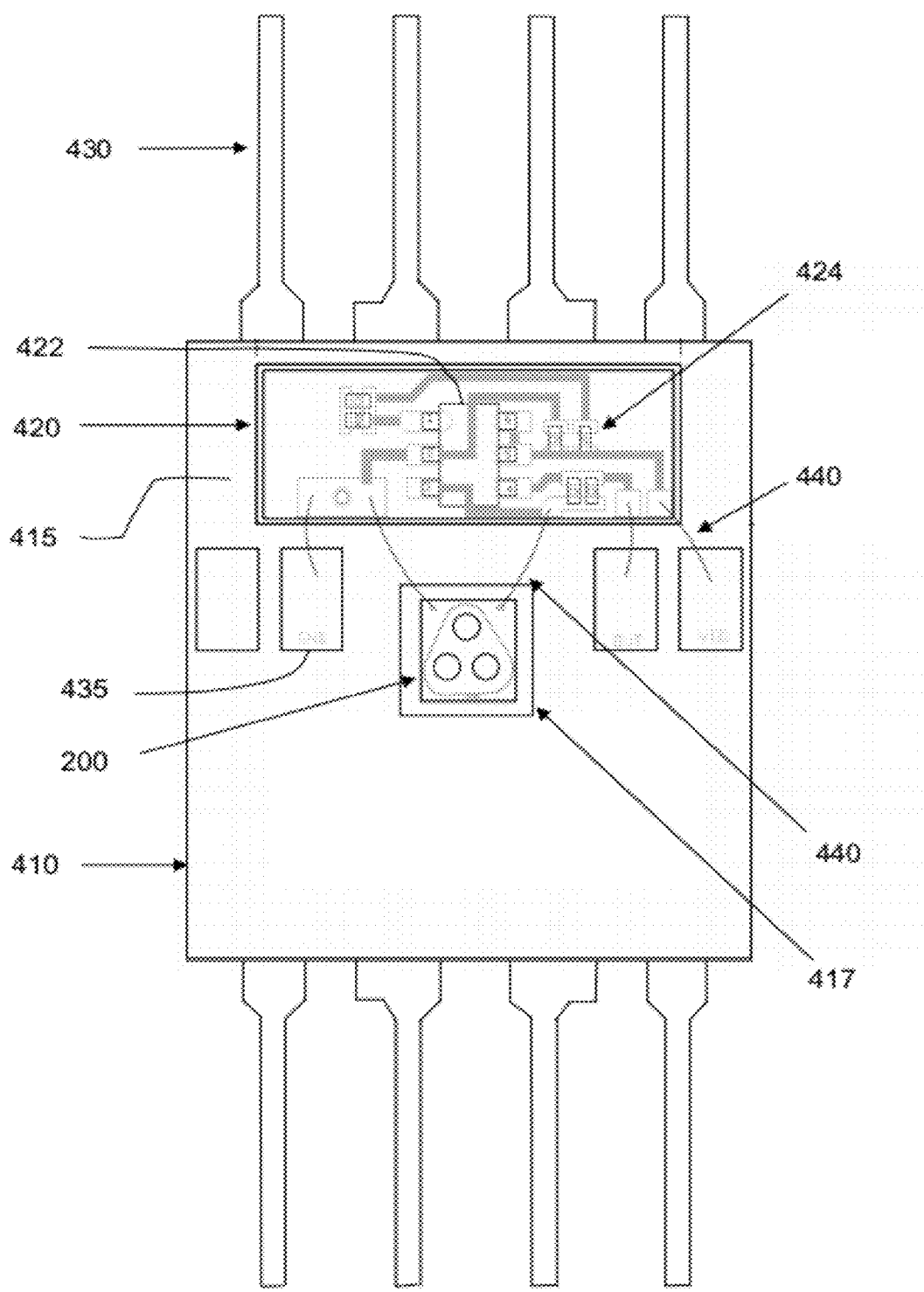
FIG. 4 shows a top cutaway view of one embodiment of a packaged acoustic device.
Figure 5:
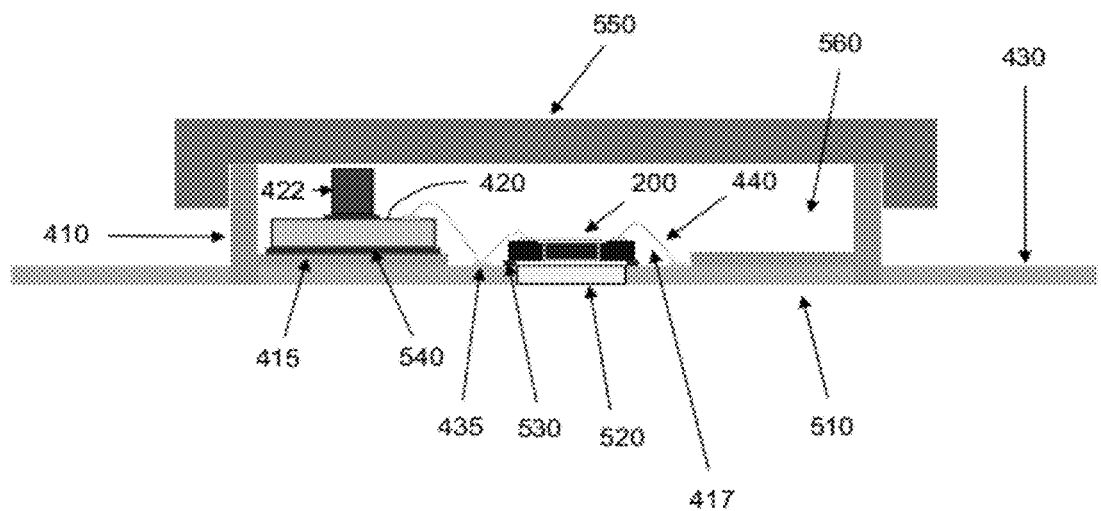
FIG. 5 shows a side view of a portion of one embodiment of a packaged acoustic device.

FIG. 4 shows a top cutaway view, and FIG. 5 shows a side cutaway view, of a portion of one embodiment of a packaged acoustic device 400. Packaged acoustic device 400 includes a housing 410, on which is mounted a substrate 420, and a plurality of terminal leads 430.

As shown in FIG. 5, terminal leads 430 are integrally connected to a lead frame 510 on which is mounted semiconductor die 200 having one or more (e.g., three) acoustic transducers. Of course in other embodiments, other semiconductor dies, for example semiconductor dies 100 or 300, having different numbers and/or configurations of acoustic transducers could be employed instead of semiconductor die 200. As shown in FIG. 5, lead frame 510 includes an aperture 520 passing therethrough located in a central region of lead frame 510. Semiconductor die 200 is disposed above aperture 520 so as to facilitate communication of acoustic waves or signals between the acoustic transducer(s) of semiconductor die 200 and an exterior of packaged acoustic device 400. In one embodiment, semiconductor die 200 is attached to lead frame 510 by an adhesive 530 such as an epoxy.

Lead frame 510 is formed from an electrically conductive material, such as various metals and metal alloys, including copper, nickel, aluminum, brass, copper/zinc alloys, and the like, or a combination thereof, for example. The material may be etched to form separate conductors and terminal leads 430, as well as other features, such as aperture 520 and pads 435. Lead frame 510 may also be plated for wirebonding, for example, using an optimized plating material, such as nickel and/or gold, to permit gold or aluminum wirebond attachment.

Housing 410 further includes a base portion 415 on which substrate 420 is mounted. The base portion 415 of housing 410 has an aperture 417 therethrough in the area where semiconductor die 200 is mounted on lead frame 510.

Housing 410 is formed from a non-conductive material, such as various plastics or polymers, including liquid crystal polymer (LCP), polybutylene terephthalate (PBT), polypropylene (PP), polyphthalamide (PPA), and the like, for example.

In a beneficial embodiment, housing 410 includes an acoustic horn (not shown in FIGS. 4 and 5) on an opposite side of lead frame 510 from semiconductor die 200, for coupling acoustic waves between the ambient air atmosphere and the acoustic transducer(s) of semiconductor die 200. Further description of such an acoustic horn will be provided below with respect to FIG. 6.

Substrate 420 is mounted on base portion 415 of housing 410, for example by means of an adhesive 540 such as an epoxy. In the illustrated embodiment, substrate 420 is a printed circuit board. Beneficially, substrate 420 may be a ceramic or alumina ceramic substrate with electrically conductive pads and traces formed thereon, for example by a thick film printing metallization process.

Substrate 420 has mounted thereon an amplifier, which may be an operational amplifier. In the illustrated embodiment, the amplifier includes an integrated circuit device 422 with active elements, and one or more external components 424 (e.g., resistor(s), capacitor(s), etc.) for setting at least one operating parameters (e.g., gain, bandwidth, etc.) of the amplifier, and/or for filtering one or more supply voltages provided to the amplifier. In the illustrated example, integrated circuit device 422 is a packaged semiconductor die with leads connected to metal traces on substrate 420. However in other embodiments, integrated circuit device 422 may comprise an unpackaged semiconductor die. In some embodiments, the parameter-setting resistor(s)/capacitor(s) may be incorporated within the semiconductor die.

Bond wires 440 electrically and operationally connect the amplifier to the acoustic transducer(s) of semiconductor die 200, directly and/or via intermediate connections to pads 435 of lead frame 510. Also, bond wires 440 connect the amplifier to one or more supply voltages, including ground, supplied via terminal leads 430. Such connections may be made via one or more pads 435.

As shown in FIG. 5, packaged acoustic device 400 further includes a lid or cap 550. Lid 550 is attached to the combined lead frame 510 and housing 410. Lid 550 may be previously formed, for example, using a molding process. As shown in FIG. 5, lid 550 fits over lead frame 510 and housing 410, and together with base portion 415 of housing 410 defines a cavity 560. Semiconductor die 200 including its acoustic transducer(s), and the amplifier including integrated circuit device 422, are both disposed within cavity 560. Terminal leads 430 extend from the encasement formed by lead frame 510, lid 550, and base portion 415 of housing 410, to enable electrical contact between external circuits and the amplifier and/or acoustic transducer(s) of packaged acoustic device 400. In one embodiment, lid 550 is mechanically attached to base portion 415 of housing 410 by press fitting, for example. Alternatively or in addition, lid 550 may be attached to base portion 415 of housing 410 using an epoxy adhesive, for example, creating a hermetically sealed environment. Of course, other means of attachment, such as soldering, clamping, and the like, may be incorporated without departing from the scope of the present teachings.

Figure 6:
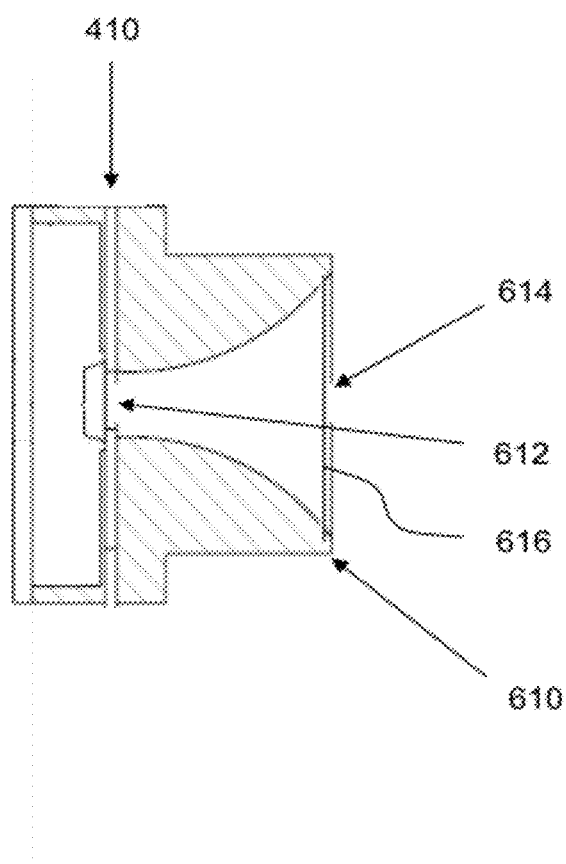
FIG. 6 shows a side cutaway view of one embodiment of a packaged acoustic device.

FIG. 6 shows a side cutaway view of packaged acoustic device 400. As can be seen in FIG. 6, housing 410 includes an acoustic horn 610 disposed on an opposite side of lead frame 510 from semiconductor device 220 and cavity 560.

Generally, horns may be used to amplify acoustic signals, making them louder, as indicated by the incorporation of horns in various musical instruments and early hearing aids, for example. Horns may also be used to manipulate radiation patterns of acoustic emitters, generally referred to as beam forming or beam shaping, thus affecting dispersion of the acoustic signals. In addition, horns may provide impedance matching, rendering an acoustic transducer more compatible with the medium through which the acoustic signals travel.

In the depicted embodiment, acoustic horn 610 is integral with housing 410 including base portion 415 that abuts a first side (e.g., bottom side) of lead frame 510 and a protruding portion that extends from base portion 415 along a center axis in a direction substantially perpendicular to lead frame 510. In a representative embodiment, housing 410 including acoustic horn 610 is formed from plastic transfer molded to lead frame 510, as discussed below.

In the depicted embodiment, acoustic horn 610 has a generally hyperbolic or exponential cross-sectional shape, such that an inner dimension of acoustic horn 610 extends outwardly from an inner aperture or throat 612 to a flared outer aperture or mouth 614. For example, the throat 612 may be circular with a diameter of about 2 mm and the mouth 614 may likewise be circular with a diameter of about 8 mm. However, the sizes and shapes of acoustic horn 610 and corresponding throat 612 and mouth 614, as well as the respective configurations of the base portion 415 and the protruding portion, may vary to provide unique benefits for any particular situation or to meet application specific design requirements of various implementations, as would be apparent to one skilled in the art. For example, the cross-sectional shape of the protruding portion may be substantially conical, tubular, rectangular or trapezoidal, without departing from the scope of the present teachings.

Acoustic horn 610 may be molded in the shape depicted, for example, in FIG. 6, using transfer molding or other molding techniques, to support different environmental and operating conditions.

Beneficially, semiconductor die 200 includes an acoustic transducer having a suspended portion or membrane. In a beneficial embodiment, the membrane is exposed to the exterior of packaged acoustic device 400 through a back-etched portion of semiconductor die 200, and aperture 520 in lead frame 510, which are substantially aligned with throat 612 of acoustic horn 610. The back-etched portion may be formed in a substrate of semiconductor die 200, which may include various types of materials, such as glass, sapphire, alumina, or the like, or any semiconductor material, such as silicon, gallium arsenide (GaAs), indium phosphide (InP), or the like, by machining or by chemically etching the substrate using photolithography, although various alternative techniques may be incorporated. In an embodiment, by being formed on the bottom of the lead frame 510, acoustic horn 610 provides optimized low acoustic loss based on the mounting of semiconductor die 200 through the back-etched portion and aperture 520.

As stated above, the acoustic transducer may be a MEMS transducer, for example, for converting electronic signals to acoustic signals (e.g., ultrasonic signals) and/or for converting acoustic signals to electronic signals. In an embodiment, the acoustic transducer may be a thin film piezoelectric device and may include a stacked structure of a bottom electrode, a piezoelectric film, and a top electrode. The piezoelectric film can be formed from a material, such as aluminum nitride, lead zirconate titanate (PZT), or other film compatible with semiconductor processes. In another embodiment, acoustic transducer may include a piezoelectric crystal. The bottom and top electrodes may be formed from a metal compatible with semiconductor processes, such as molybdenum, tungsten, aluminum or a combination thereof.

In an embodiment, a protective mesh or barrier screen (hereinafter "screen") 616 covers mouth 614 of acoustic horn 610. Beneficially, screen 616 may include a pattern of apertures (not shown) for communicating acoustic signals between the acoustic transducer(s) of semiconductor die 200 and the exterior of packaged acoustic device 400. For example, each of the apertures of screen 616 may be substantially smaller than the size of aperture 520 in lead frame 510. Screen 616 may include acoustically transparent solid material to allow acoustic signals to exit and/or enter aperture 520, but limiting debris, contaminants and/or moisture that can enter aperture 520. In an embodiment, screen 616 is positioned directly in mouth 614 of the protruding portion of acoustic horn 610. Screen 616 may be applied after assembling the packaged acoustic device 400, including attachment of lid 550.

FIGS. 7A-F illustrate various stages in one embodiment of a process of manufacturing packaged acoustic device 400.

Figure 7A:
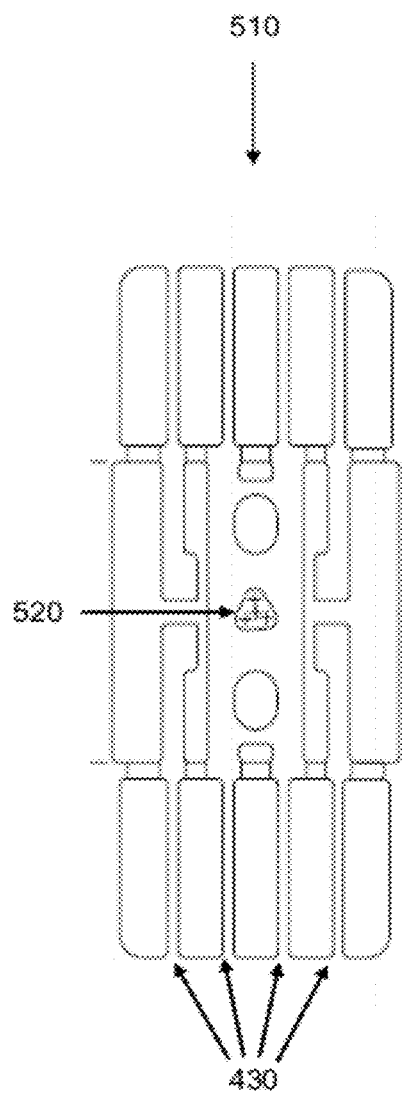
FIGS. 7A-F illustrate various stages in on embodiment of a process of manufacturing a packaged acoustic device.

FIG. 7A shows lead frame 510 including terminal leads 430 and aperture 520 provided in a central region thereof. As discussed above, lead frame 510 may be plated for wirebonding, for example, using an optimized plating material, such as nickel and/or gold, to permit gold or aluminum wirebond attachment.

Figure 7B:
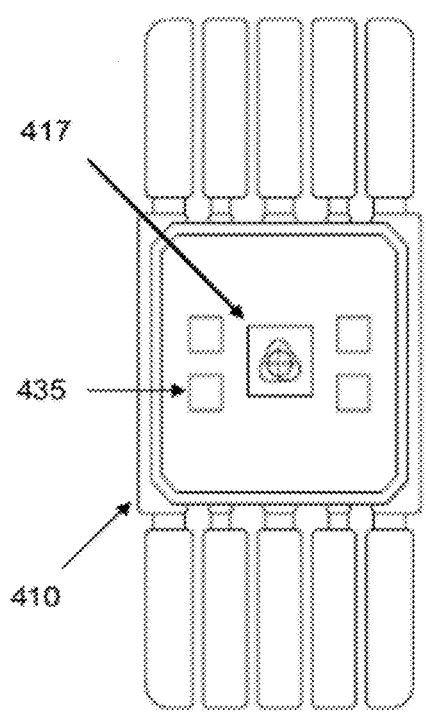

FIG. 7B shows a next intermediate product where housing 410 has been attached to lead frame 510.

In an example embodiment, a molding operation is performed on lead frame 510. The molding operation includes placing lead frame 510 in a transfer mold previously formed to define the shape of housing 410, including for example base portion 415 and acoustic horn 610. A polymer, e.g., LCP, PBT, PP, or PPA, is then transfer molded, for example, to encapsulate lead frame 510 and to simultaneously form housing 410, for example including acoustic horn 610. The polymer is typically a solid at room temperature, and melted prior to transfer to the mold. The shape of acoustic horn 610 is defined by the shape of the machined transfer mold. The cooled (after melting) mold plastic will assume the horn shape within the transfer mold. Accordingly, housing 410, including for example plastic acoustic horn 610 as shown in FIG. 6, is integrally formed to surround lead frame 510 during the molding operation.

Figure 7C:
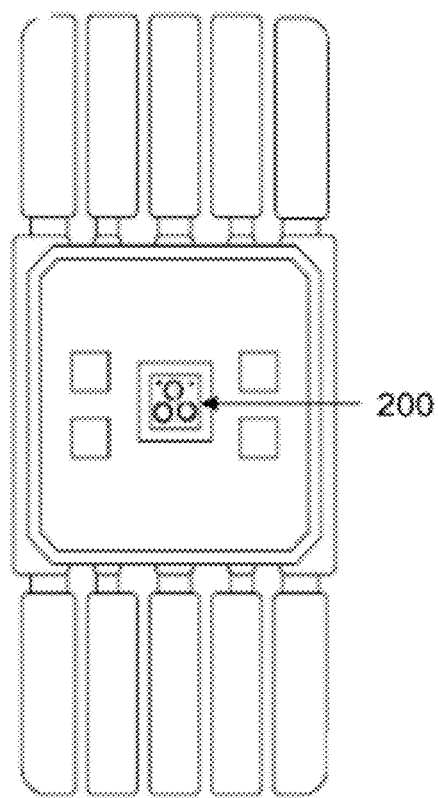

FIG. 7C shows a next intermediate product where semiconductor die 200 including acoustic transducer(s) are mounted on lead frame 510 above aperture 520, for example by an adhesive bond.

Figure 7D:
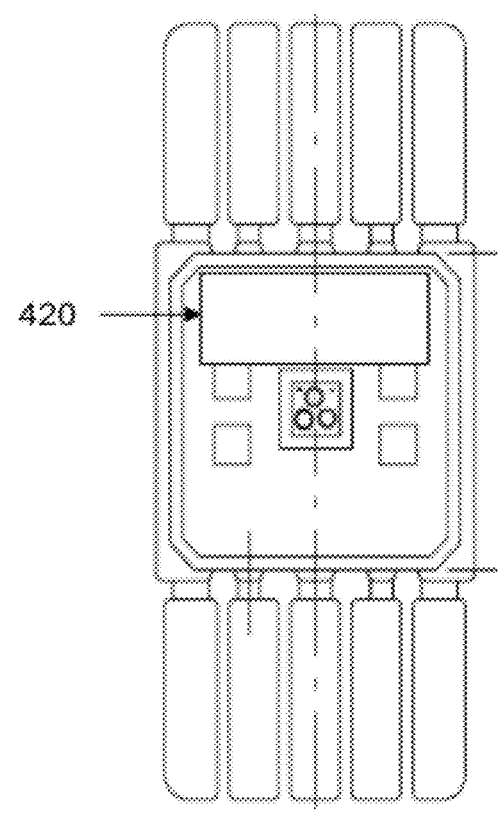

FIG. 7D shows a next intermediate product where substrate 420 including the amplifier (e.g., an operational amplifier), is mounted on base portion 415 of housing 410, for example by an adhesive bond.

Figure 7E:
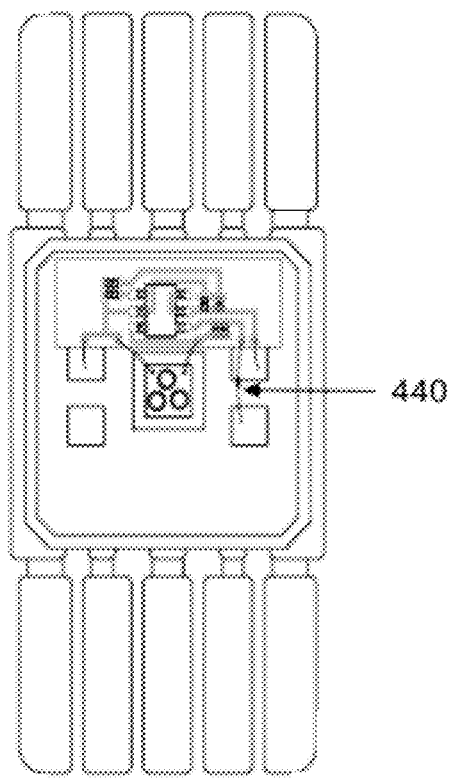

FIG. 7E shows a next intermediate product where one or more wire bonds 440 are applied to provide connections between the amplifier and/or acoustic transducer(s) of semiconductor die 200 and/or pads 435 of lead frame 510.

Figure 7F:
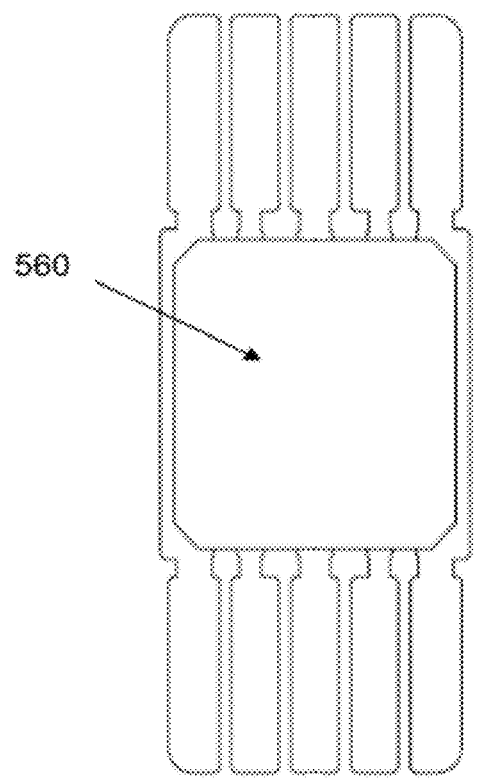

FIG. 7F shows a next intermediate product where lid 550 has been applied to housing 410 and lead frame 510.

Although not specifically shown in FIGS. 7A-F, in a step somewhere in the manufacturing process terminal leads 430 are disconnected front a supporting lead frame structure.

Figure 8:
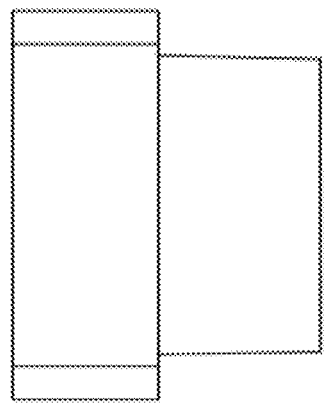
FIG. 8 shows a side view of one embodiment of a packaged acoustic device.
Figure 9:
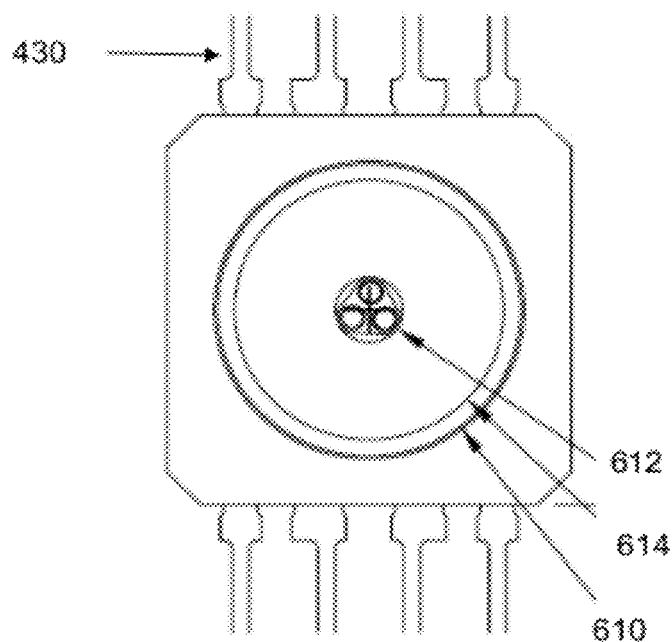
FIG. 9 shows a bottom view of one embodiment of a packaged acoustic device.

FIG. 8 shows a side view of the final packaged acoustic device 400,

FIG. 9 shows a bottom view of the final packaged acoustic device 400.

While example embodiments are disclosed herein, one of ordinary skill in the art appreciates that many variations that are in accordance with the present teachings are possible that remain within the scope of the appended claims. The embodiments therefore are not to be restricted except within the scope of the appended claims.

The invention claimed is:

1. A device, comprising:
   an electrically conductive lead frame having an aperture therethrough;
   a semiconductor die mounted on the lead frame, and including at least one acoustic transducer disposed above the aperture and configured to convert between acoustic energy and an electrical signal;
   an acoustic horn integrally connected to the lead frame, the horn extending from the lead frame and comprising a throat positioned adjacent to the acoustic transducer and a mouth opening at an opposite end of the acoustic horn from the throat;
   a substrate mounted on a base portion of the acoustic horn;
   an amplifier mounted on the substrate and being electrically connected to the acoustic transducer; and
   a lid configured together with a base portion of a housing to define a cavity, wherein the acoustic transducer and the amplifier are positioned within the cavity.

2. The device of claim 1, wherein the amplifier comprises an operational amplifier fabricated as an integrated circuit and one or more external components for configuring an operating parameter of the operational amplifier.

3. The device of claim 1, further including at least one bond wire connected between a pad on the substrate and at least one lead of the lead frame.

4. The device of claim 1, further including at least one bond wire connected between a pad on the substrate and a pad on the semiconductor die.

5. The device of claim 1, wherein the acoustic transducer comprises a micro electro-mechanical system (MEMS) transducer.

6. The device of claim 1, wherein the cavity is hermetically sealed.

7. The device of claim 1, wherein the acoustic horn comprises plastic transfer molded through a portion of the lead frame and extending from the lead frame to the mouth of the horn.

8. The device of claim 1, wherein the substrate is a printed circuit substrate attached to the housing by glue.

9. The device of claim 8, wherein the substrate comprises alumina ceramic material.

10. A device, comprising:
    an electrically conductive lead frame having an aperture therethrough;
    at least one acoustic transducer mounted on the lead frame above the aperture and configured to convert between acoustic energy and an electrical signal;
    a housing connected to the lead frame and including a base portion on a same side of the lead frame as the acoustic transducer, wherein the housing comprises an acoustic horn having a first opening at an end where the housing is connected to the lead frame, the first opening surrounding the aperture in the lead frame, and having a second opening at an opposite end of the acoustic horn from the first opening, wherein a diameter of the second opening is greater than a diameter of the first opening;
    an amplifier provided on a base portion of the housing; and
    a lid configured together with the base portion of the housing to define a cavity, wherein the acoustic transducer and the amplifier are positioned within the cavity.

11. The device of claim 10, further comprising a printed circuit substrate mounted on the base portion of the housing, wherein the amplifier is mounted on the printed circuit substrate.

12. The device of claim 10, wherein the amplifier comprises an operational amplifier fabricated as an integrated circuit and one or more external components for configuring an operating parameter of the operational amplifier.

13. The device of claim 10, further including at least one bond wire connected between a pad on the substrate and at least one lead of the lead frame.

14. The device of claim 10, further including at least one bond wire connected between a pad on the substrate and a pad on the semiconductor die.

15. The device of claim 10, wherein the acoustic transducer comprises a micro electro-mechanical system (MEMS) transducer.

16. The device of claim 10, wherein the cavity is hermetically sealed.

17. The device of claim 10, wherein the housing comprises plastic transfer molded through a portion of the lead frame.

18. The device of claim 10, wherein the acoustic transducer is disposed on a semiconductor die.

* * * * *